United States Patent
Vasat et al.

(10) Patent No.: US 6,743,495 B2
(45) Date of Patent: Jun. 1, 2004

(54) THERMAL ANNEALING PROCESS FOR PRODUCING SILICON WAFERS WITH IMPROVED SURFACE CHARACTERISTICS

(75) Inventors: Jiri L. Vasat, Chesterfield, MO (US); Andrei Stefanescu, O'Fallon, MO (US); Thomas A. Torack, Oakland, MO (US); Gregory M. Wilson, Chesterfield, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 49 days.

(21) Appl. No.: 10/113,378

(22) Filed: Mar. 29, 2002

(65) Prior Publication Data

US 2002/0174828 A1 Nov. 28, 2002

Related U.S. Application Data

(60) Provisional application No. 60/280,035, filed on Mar. 30, 2001, and provisional application No. 60/300,208, filed on Jun. 22, 2001.

(51) Int. Cl.[7] ............................... H01L 29/06; H01L 27/01
(52) U.S. Cl. ........................ 428/64.1; 428/446; 117/3; 117/928; 423/348
(58) Field of Search ....................... 428/64.1, 446; 117/3, 58, 931, 932, 928; 423/348; 438/471, 795

(56) References Cited

U.S. PATENT DOCUMENTS

| | | | |
|---|---|---|---|
| 5,506,176 A | * | 4/1996 | Takizawa .................... 438/477 |
| 5,919,302 A | | 7/1999 | Falster et al. |
| 6,010,797 A | | 1/2000 | Tomita et al. |
| 6,190,631 B1 | | 2/2001 | Falster et al. |
| 6,236,104 B1 | | 5/2001 | Falster |
| 6,342,725 B2 | | 1/2002 | Falster |
| 6,458,202 B1 | * | 10/2002 | Kojima et al. ............... 117/13 |
| 2002/0160591 A1 | * | 10/2002 | Akiyama et al. ............ 438/530 |

OTHER PUBLICATIONS

D. Gräf, et al., Improvement of Czochralski Silicon Wafers by High–Temperature Annealing, The Electrochemical Society, Sep. 1995, vol. 142, No. 9., pp. 3189–3192.

D. Gräf, et al., Characterization of Crystal Quality by Delineation of Cop and the Impact on the Silicon Wafer Surface, Electrochemical Society Proceedings, 1996, vol. 96–13, pp. 117–131.

Tamatsuka, et al., Oxide Defect Annihilation/Generation Following High Temperature Annealing: A Gate Oxide Integrity Evaluation, Electrochemical Society Proceedings, 1997, vol. 97–3, pp. 183–194.

(List continued on next page.)

*Primary Examiner*—Stephen Stein
(74) *Attorney, Agent, or Firm*—Senniger, Powers, Leavitt & Roedel

(57) ABSTRACT

A process for manufacturing silicon wafers that reduces the size of silicon wafer surface and/or sub-surface defects without the forming excessive haze. The process entails cleaning the front surface of the silicon wafer at a temperature of at least about 1100° C. by exposing the front surface to a cleaning ambient comprising $H_2$, HF gas, or HCl gas to remove silicon oxide from the front surface and exposing the cleaned front surface of the silicon wafer at a temperature of at least about 1100° C. to a vacuum or an annealing ambient consisting essentially of a mono-atomic noble gas selected from the group consisting of He, Ne, Ar, Kr, and Xe to facilitate the migration of silicon atoms to the exposed agglomerated defects without substantially etching silicon from the front surface of the heated silicon wafer.

18 Claims, 6 Drawing Sheets

OTHER PUBLICATIONS

D. Gräf, et al., Characterization of Crystal Quality by Crystal Originated Particle Delineation and the Impact on the Silicon Wafer Surface, Journal of the Electrochemical Society, Jan. 1998, vol. 145, No. 1, pp. 275–284.

Takao Abe, A History and Future of Silicon Crystal Growth, Electrochemical Society Proceedings, 1998, vol. 98–1, pp. 157–178.

M. Iida, et al., Effects of Light Element Impurities on the Formation of Grown–In Defects Free Region of Czochralski Silicon Single Crystal, Electrochemical Society Proceedings, 1999, vol. 99–1, pp. 499–510.

N. Adachi, et al., Reduction of Grown–In Defects by High Temperature Annealing, Journal of the Electrochemical Society, Jan. 2000, vol. 147, No. 1, pp. 350–353.

* cited by examiner

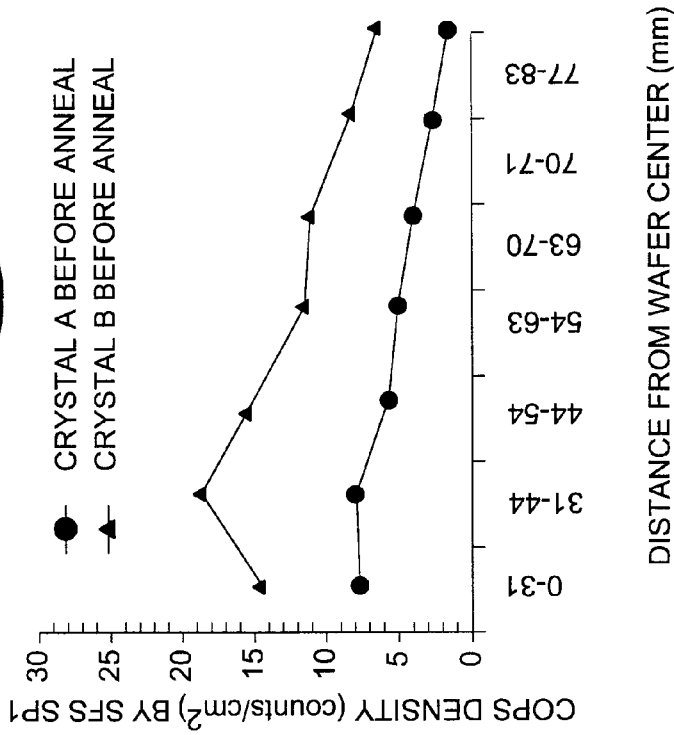
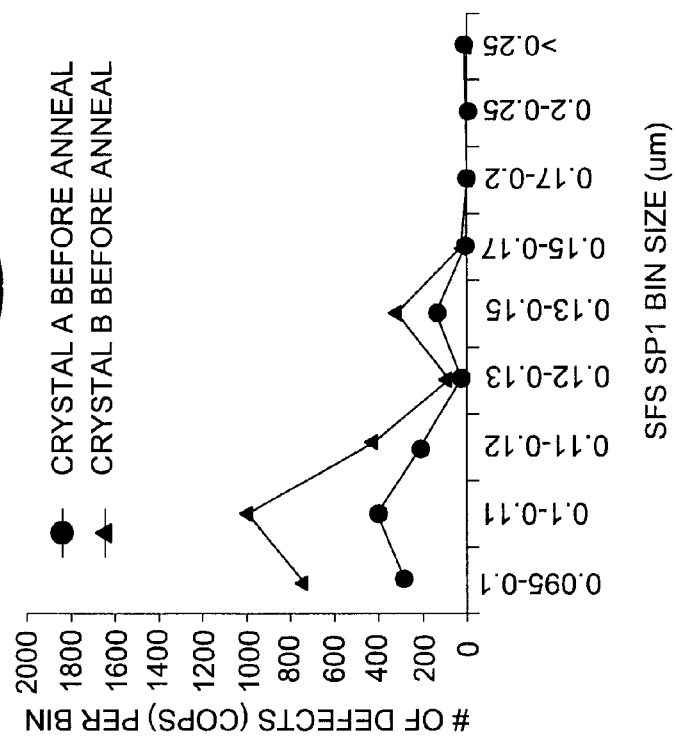
FIG. 2

THERMAL ANNEALING PROCESS FOR PRODUCING SILICON WAFERS WITH IMPROVED SURFACE CHARACTERISTICS

CROSS-REFERENCE TO RELATED APPLICATION

This application claims the benefit of U.S. Provisional Application No. 60/280,035, filed Mar. 30, 2001 and U.S. Provisional Application No. 60/300,208 filed on Jun. 22, 2001 which are hereby incorporated by reference for all purposes.

BACKGROUND OF THE INVENTION

The present invention generally relates to the preparation of semiconductor material substrates, especially silicon wafers, which are used in the manufacture of electronic components. More particularly, the present invention relates to a process for thermally treating or annealing a silicon wafer to reduce the concentration of agglomerated vacancy defects without substantially increasing the appearance of haze on the surface of the thermally treated silicon wafer.

Single crystal silicon wafers are commonly manufactured by a process which starts with the growth of a monocrystalline silicon ingot produced by the Czochralski ("Cz") method or the float-zone (FZ) method. The crystal ingot is typically sliced into wafers with a wire-saw, the wafers are flattened by lapping and chemically etched to remove mechanical damage and contamination. After being etched, the wafers are polished on one or both sides.

A polished wafer typically has undesirable defects (e.g., Crystal Originated Pits/Particles (COPs)) on the surface that were formed as the ingot cooled after solidification which are detectable by laser scatter inspection tools. Such defects arise, in part, due to the presence of an excess (i.e. a concentration above the solubility limit) of intrinsic point defects, which are known as vacancies and self-interstitials. Silicon crystals grown from a melt are typically grown with an excess of one or the other type of intrinsic point defect, either crystal lattice vacancies or silicon self-interstitials. It has been suggested that the type and initial concentration of these point defects in the silicon are determined at the time of solidification and, if these concentrations reach a level of critical supersaturation in the system and the mobility of the point defects is sufficiently high, a reaction, or an agglomeration event, will likely occur. Agglomerated intrinsic point defects in silicon can severely impact the yield potential of the material in the production of complex and highly integrated circuits. Examples of vacancy-type intrinsic point defects (hereinafter "agglomerated vacancy defects") include dislocations, surface defects, Flow Pattern Defects (FPDs), COPs, and oxidation induced stacking faults (OISF).

To date, there generally exists three main approaches to dealing with the problem of agglomerated intrinsic point defects. The first approach includes methods which focus on crystal pulling techniques in order to reduce the number density of agglomerated intrinsic point defects in the ingot. For example, it has been suggested that the number density of agglomerated defects can be reduced by (i) controlling v/Go to grow a crystal in which crystal lattice vacancies are the dominant intrinsic point defect, and (ii) influencing the nucleation rate of the agglomerated defects by altering (generally, by slowing down) the cooling rate of the silicon ingot from about 1100° C. to about 1050° C. during the crystal pulling process. While this approach reduces the number density of agglomerated defects, it does not prevent their formation and reducing the cooling rate decreases the throughput of the crystal growth apparatus thereby increasing the cost of producing wafers.

A second approach to dealing with the problem of agglomerated vacancy defects is the epitaxial deposition of a thin crystalline layer of silicon on the surface of a single crystal silicon wafer. This process provides a single crystal silicon wafer having a surface which is substantially free of agglomerated vacancy defects; however, the cost of the wafer substantially increases.

The third approach to dealing with the problem of agglomerated vacancy defects includes methods which focus on the dissolution or annihilation of the vacancy defects subsequent to their formation. Generally, this is achieved by using high temperature heat treatments of silicon wafers. The reduction of COPs is of particular interest because Gate Oxide Integrity failures correlate to the concentration of COPs on the wafer surface. D. Graf, M. Suhren, U. Schmilke, A. Ehlert, W. v. Ammon and P. Wagner., *J. Electrochem. Soc.* 1998, 145, 275; M. Tamatsuka, T. Sasaki, K. Hagimoto and G. A. Rozgonyi, Proc. 6th. Int. Symp. On Ultralarge Scale Integration Science and Technology "ULSI Science and Technology/ 1997," *The Electrochemical Society* 1997, PV97-3, p. 183; and T. Abe, *Electrochem. Soc. Proc.* 1998, PV98-1, 157; N. Adachi, T. Hisatomi, M. Sano, H. Tsuya, *J. Electrochem. Soc.* 2000, 147, 350. COPs within an ingot or wafer are octahedral voids. At the surface of a wafer, the COPs appear as pits with silicon dioxide covered walls and are typically about 50–300 nm wide and can be up to about 300 nm deep. It is presently believed that heat treating a wafer in certain ambients increases the migration of silicon atoms to the COPs which decreases the depth of the COPs until they appear as shallow dish-like depressions that are not usually detected by automated inspection tools.

Previously disclosed heat treatments, or thermal annealing processes, include long term annealing in a hydrogen atmosphere (e.g., longer than about 30 minutes) which produces virtually COP-free surfaces, however, the duration is cost prohibitive. D. Graf, U. Lambert M. Brohl, A. Ehlert, R. Wahlich, P. Wagner., *J. Electrochem. Soc.* 1995, 142, 3189. Short term hydrogen annealing processes (less than about 5 minutes) do not sufficiently annihilate COPs. A significant drawback to annealing a silicon wafer in a hydrogen ambient (short or long term) is the significant increase in haze on the wafer surface (e.g., to levels greater than about 1.2 ppm measured by a SURFSCAN 6220 laser scatter inspection tool or to levels greater than about 0.2 ppm measured by a SURESCAN SP1 laser scatter inspection tool which are available from KLA-Tencor of San Jose, Calif., U.S.A.). Annealing a wafer in an argon ambient has also been disclosed. D. Graf, M. Suhren, U. Lambert, R. Schmolke, A. Ehlert, W. v. Ammon and P. Wagner, *Electrochem. Soc. Proc.* 1996, 96-13, 117; Iida, W. Kusaki, M. Tamatsura, E. Iino, M. Kimura and S. Murasoka, *Electrochem. Soc. Proc.* 1999, 99-1, 449. Although annealing in argon annihilates COPs at the surface and near-surface (e.g., extending inward from the surface about 5000 nm) of the wafer more effectively than an $H_2$ ambient, it results in considerably higher haze levels than that of $H_2$ annealing. Short high temperature annealing cycles (less than about 5 minutes) in a mixture of $H_2$ and Ar have also been attempted for surface COP annihilation and GOI improvement with similar increases in the haze. T. Abe, *Electrochem. Soc. Proc.* 1998, 98-1, 157; M. Tamatsuka, N. Kobayashi, S. Tobe, and T. Masiu, *Electrochem. Soc Proc,* 1999, 99-1, 456); D. Gräf, M. Suhren, U. Lambert, R. Schmolke, A.

Ehlert, W. v. Ammon, and P. Wagner, *Electrochem. Soc. Proc.* 1996, 96-13, 117; and W. Iida, M. Kusaki, E. Tamatsura, M. K. Iino S. Muraoka, *Electrochem. Soc. Proc.* 1999, 99-1, 449.

In view of these shortcomings, a need continues to exist for a low-cost method to annihilate or reduce the size of silicon wafer surface and/or sub-surface defects without the formation of excessive haze.

SUMMARY OF THE INVENTION

Among the objects of the present invention, therefore, is the provision of a low-cost process for the manufacture of silicon wafers to reduce the size of silicon wafer surface and/or sub-surface defects without the formation of excessive haze.

Briefly, therefore, the present invention is directed to a process for manufacturing a silicon wafer sliced from a single crystal ingot, the silicon wafer having a front surface, a back surface, an imaginary central plane between the front and back surfaces, and exposed agglomerated vacancy defects on the front surface, the process comprising:

a. cleaning the front surface of the silicon wafer at a temperature of at least about 1100° C. by exposing the front surface to a cleaning ambient comprising $H_2$, HF gas, or HCl gas to remove silicon oxide from the front surface; and b. exposing the cleaned front surface of the silicon wafer at a temperature of at least about 1100° C. to a vacuum or an annealing ambient that removes less than about 0.1 nm/mm of silicon from the cleaned front surface of the silicon wafer to facilitate the migration of silicon atoms to the exposed agglomerated vacancy defects thereby reducing the size of the exposed agglomerated vacancy defects.

This invention is also directed to a process for manufacturing a silicon wafer comprising:

a. growing a silicon ingot having a {100} crystallographic orientation and a density of agglomerated vacancy defects of about $1 \times 10^3/cm^3$ to about $1 \times 10^7/cm^3$;

b. slicing the silicon wafer from the silicon ingot off the [100] direction by about 1 minute to about 13 minutes off the x-axis and about 1 minute to about 13 minutes off the y-axis, the silicon wafer having a front surface, back surface, the front surface comprising exposed agglomerated vacancy defects;

c. heating the silicon wafer to an annealing temperature of at least about 1100° C. at an average rate of about 1° C./sec to about 30° C./sec;

d. cleaning the front surface of the silicon wafer at the annealing temperature by exposing the front surface to a cleaning ambient consisting essentially of $H_2$ gas for about 15 seconds to about 60 seconds to remove silicon oxide from the front surface;

e. exposing the cleaned front surface of the silicon wafer at the annealing temperature to an annealing ambient consisting essentially of Ar for about 10 seconds to about 5 minutes; and f. cooling the silicon wafer from the annealing temperature to a temperature below about 900° C. at an average rate of about 1° C./sec to about 30° C./sec while exposing the front surface of the silicon wafer to the annealing ambient after step e.

The invention is also directed to a process for manufacturing a silicon wafer sliced from a single crystal ingot, the silicon wafer having a front surface, a back surface, and an imaginary central plane between the front and back surfaces, the process comprising:

a. cleaning the front surface of the silicon wafer at a temperature of at least about 1100° C. by exposing the front surface to a cleaning ambient comprising $H_2$, HF gas, or HOI gas to remove silicon oxide from the front surface, the cleaned front surface having more than about 0.5 light point defects per $cm^2$; and b. exposing the cleaned front surface of the silicon wafer at a temperature of at least about 1100° C. to a vacuum or an annealing ambient that removes less than about 0.1 nm/mm of silicon from the cleaned front surface of the silicon wafer to reduce the concentration of light point defects on the front surface of the silicon wafer by at least about 50%.

The invention is also directed to a process for manufacturing a silicon wafer sliced from a single crystal ingot, the silicon wafer having a front surface, a back surface, an imaginary central plane between the front and back surfaces, and agglomerated vacancy defects dispersed throughout the volume of the wafer, the process comprising:

a. cleaning the front surface of the silicon wafer at a temperature of at least about 1100° C. by exposing the front surface to a cleaning ambient comprising $H_2$, HF gas, or HCl gas to remove silicon oxide from the front surface, the agglomerated vacancy defects in the cleaned silicon wafer having a width that is between about 50 nm and about 300 nm; and b. exposing the cleaned front surface of the silicon wafer at a temperature of at least about 1100° C. to a vacuum or an annealing ambient that removes less than about 0.1 nm/mm of silicon from the cleaned front surface of the silicon wafer for a duration sufficient to create a stratum extending from the front surface inward a distance of about 5 nm to about 500 nm in which the width of the agglomerated vacancy defects is reduced.

The invention is also directed to a process for manufacturing a silicon on insulator structure, the silicon on insulator structure comprising a handle wafer having a back surface and a front surface, a single crystal silicon device layer having a back surface and a front surface, an insulating layer between the front surface handle wafer and the back surface of the device layer and exposed agglomerated vacancy defects on the front surface of the device layer, the process comprising:

a. cleaning the front surface of the device layer at a temperature of at least about 1100° C. by exposing the front surface of the device layer to a cleaning ambient comprising $H_2$, HF gas, or HCl gas to remove silicon oxide from the front surface of the device layer; and b. exposing the cleaned front surface of the device layer at a temperature of at least about 1100° C. to a vacuum or an annealing ambient that removes less than about 0.1 nm/mm of silicon from the front surface of the device layer to facilitate the migration of silicon atoms to the exposed agglomerated vacancy defects thereby reducing the size of the exposed agglomerated vacancy defects.

This invention is also directed to a single crystal silicon wafer having two generally parallel surfaces, one of which is the front surface of the wafer and the other of which is the back surface of the wafer, an imaginary central plane between the front and back surfaces, a circumferential edge joining the front and back surfaces, and agglomerated vacancy defects dispersed throughout the volume of the wafer, the wafer being characterized in that:

the silicon wafer has a density of agglomerated vacancy defects of between about $1 \times 10^3$ defects/cm$^3$ and about $1 \times 10^7$ defects/cm$^3$ between the imaginary central plane and a stratum extending from the front surface inward a distance $D_s$, and a density of agglomerated vacancy defects in the stratum that is less than the density of agglomerated vacancy defects between the imaginary central plane and the stratum;

the front surface of the silicon wafer has a concentration of light point defects that is less than about 3 LPDs/cm$^2$; and the front surface of the silicon wafer has a degree of haze which allows the detection of LPDs less than about 0.21 µm LSE.

The present invention is also directed to a silicon on insulator structure having two generally parallel surfaces, one of which is the front surface of the structure and the other of which is the back surface of the structure and a circumferential edge joining the front and back surfaces of the structure, the structure comprising:

a. a single crystal silicon base layer having two generally parallel borders, one of which is the top border and the other of which is the bottom border which coincides with the back surface of the silicon on insulator structure, and an imaginary central plane between the borders;

b. a single crystal silicon device layer having two generally parallel boundaries, one of which is the upper boundary which coincides with the front surface of the structure and the other of which is the lower boundary;

c. an insulating layer between the top border of the base layer and the lower boundary of the device layer;

d. a first reduced defect stratum comprising agglomerated vacancy defects ranging in width from about 50 nm to about 300 nm dispersed throughout its volume at a density less than about $1 \times 10^3$ defects/cm$^3$, the first reduced defect stratum being generally parallel to the back surface of the structure, and having a thickness $D_{s1}$ and being located in the device layer or the base layer; and e. a first bulk stratum comprising agglomerated vacancy defects ranging in width from about 50 nm to about 300 nm dispersed throughout is volume at a density greater than about $1 \times 10^3$ defects/cm$^3$, the first bulk stratum being generally parallel to the back surface of the structure and being located in the device layer or the base layer.

Other objects and features of this invention will be in part apparent and in part pointed out hereinafter.

BRIEF DESCRIPTION OF THE DRAWINGS

FIG. 2 contains LPD plots of wafers sliced from two different crystals prior to the wafers being annealed. FIG. 2 also contains two graphs which quantify the LPD plots. The graph on the left indicates the number of defects as a function of size on the surfaces of the wafers. The graph on the right indicates the density of LPDs as a function of distance from the center of the wafer.

DETAILED DESCRIPTION OF THE PREFERRED EMBODIMENTS

In accordance with the present invention, it has been discovered that high quality, low LPD count, low haze semiconductor wafer ready for device fabrication can be produced from low cost crystal (such as fast pull CZ or continuous pull CZ crystals) in an expedient, cost-effective manner by heat treating the wafer in sequential atmospheres or ambients. The heat treatment significantly reduces the LPD counts (e.g., COPs and other agglomerated vacancy defects) on and near the wafer surface without significantly increasing the haze on the wafer surface. Furthermore, the process can produce a semiconductor wafer having denuded zones and internal gettering which can be manipulated by controlling process parameters. The process can also be integrated with the deposition of an epitaxial layer to further reduce the LPD count and the haze on the surface of the semiconductor wafer. The process can also be used to produce silicon on insulator structures which have a device layer surface and/or a handle wafer surface which has reduced LPD counts without a significantly increased level of haze.

The starting material for the present invention preferably is a single crystal silicon wafer which has been sliced from a single crystal ingot grown in accordance with any of the conventional variations of the Czochralski crystal growing method. If a wafer that is free of oxygen is desired, the starting material is preferably sliced from a single crystal ingot grown in accordance with any of the conventional variation of the float-zone crystal growing method. Growing a silicon ingot, as well as standard silicon slicing, lapping, etching, and polishing techniques, are well known in the art and disclosed, for example, in F. Shimura, *Semiconductor Silicon Crystal Technology* (Academic Press, 1989); and *Silicon Chemical Etching*, (J. Grabmaier, ed., Springer-Verlag, N.Y., 1982). The method of the present invention may be performed on a silicon wafer at any point in the manufacturing process after the slicing operation, however, the thermal treatment is preferably performed after the silicon wafer is subjected to a final polishing operation that produces a specular gloss on at least the front surface of the silicon wafer.

Figure 1:
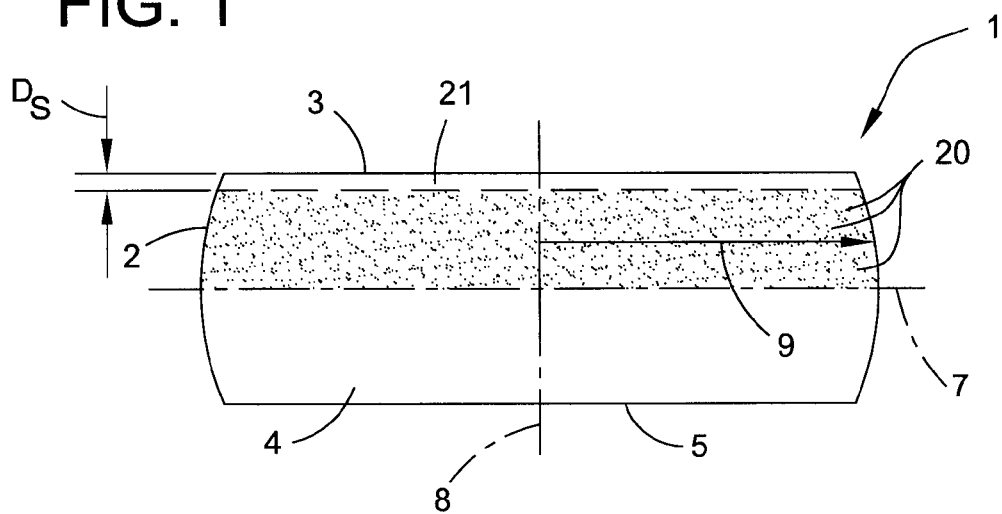
FIG. 1 shows the structure of a single crystal silicon wafer produced in accordance with the present invention.

Referring to FIG. 1, the single crystal silicon wafer has a central axis 8, a front surface 3, and a back surface 5 which are generally perpendicular to the central axis 8, an imaginary central plane 7 which is equidistant between the front and back surfaces, a circumferential edge 2 joining the front surface 3 and the back surface 5 and a radius 9 extending from the central axis to the circumferential edge 2. It should be noted that because silicon wafers typically have some total thickness variation (TTV), warp, and bow, the midpoint between every point on the front surface and every point on the back surface may not precisely fall within a plane. As a practical matter, however, the total thickness variation, warp, and bow are typically so slight that to a close approximation the midpoints can be said to fall within the imaginary central plane.

The wafer may contain one or more dopants to give the wafer various desired properties. For example, the wafer may be a P-type wafer (i.e., a wafer that has been doped with an element from Group 3 of the Periodic Table such as boron, aluminum, gallium and indium, most typically boron) or an N-type wafer (i.e., a wafer that has been doped with an element from Group 5 of the Periodic Table such as phosphorus, arsenic, antimony, most typically phosphorus). Preferably, the wafer is a P-type wafer having a resistivity of from about 100 Ω-cm to about 0.005 Ω-cm. For boron doped silicon, the foregoing resistivity values correspond to a dopant concentration of about $2.7 \times 10^{17}$ atoms/cm$^3$ to about $2 \times 10^{19}$ atoms/cm$^3$, respectively. In a particularly preferred embodiment, the wafer is a P-type wafer having a resistivity of about 20 Ω-cm to about 1 Ω-cm (generally referred to as P$^-$-silicon).

A wafer prepared using the Czochralski method typically has an oxygen concentration anywhere from about $5 \times 10^{17}$ atoms/cm$^3$ to about $9 \times 10^{17}$ atoms/cm$^3$ (in other words, from about 10 ppm to about 18 ppm (i.e., from about 10 to about 18 oxygen atoms per 1,000,000 total atoms in the wafer)) (ASTM standard F-121-80), and more typically from about $6 \times 10^{17}$ atoms/cm$^3$ to about $8.5 \times 10^{17}$ atoms/cm$^3$ (i.e., from about 12 ppm to about 17 ppm).

As mentioned above, the present invention is directed to annihilating or reducing the size of agglomerated vacancy defects such as COPs from the surface. As such, the silicon ingot from which the wafer is sliced is commonly referred to as a "void-rich ingot" that contains a relatively large number agglomerated vacancy defects. In the void-rich ingot and the void-rich wafers sliced therefrom, the density of agglomerated vacancy defects may be within the range of about $1 \times 10^3$ defects/cm$^3$ to about $1 \times 10^7$ defects/cm$^3$ and is typically between about $1 \times 10^5$ defects/cm$^3$ to about $1 \times 10^6$ defects/cm$^3$. The width of the agglomerated vacancy defects (e.g., COPs) at the wafer surface are typically about 50 nm to about 300 nm. Preferably, however, the width of the agglomerated vacancy defects is less than about 200 nm. The depth of the agglomerated vacancy defects as measured from the wafer surface toward the center of the wafer may be as deep as 300 nm (depending in part on where the wafer surface intersects each defect). Preferably, however, the maximum depth of the agglomerated vacancy defects is less than about 200 nm.

Anomalies on the surface of the silicon wafer, regardless of whether they are particles (e.g., polishing grit), agglomerated interstitial defects, or agglomerated vacancy defects (e.g., COPs) are typically detected with laser scatter inspection tools. Examples of suitable commercially available laser scatter inspection tools include the SURFSCAN 6220 and the SURFSCAN SP1 from KLA-Tencor of Mountain View, Calif., U.S.A. and the CR80, CR81 and CR82 from ADE Optical Systems Corp. of Charlotte, N.C., U.S.A. Such tools can determine the size and location of defects on the silicon wafer surface (commonly referred to as LPDs). It is well known in the art that when measuring the size of LPDs on the surface of a wafer using a laser scatter inspection tool, the actual size of the LPD is not determined; rather, the detected defect (i.e., light scattering event) scatters light equivalent to a latex sphere (LSE) of a particular diameter (e.g., a latex sphere with a diameter larger than about 0.095 μm which is the current detection limit for laser scatter inspection tools such as the SURFSCAN 6220 and the SURFSCAN SP1). Prior to being thermally treated, a void-rich wafer has a concentration of LPDs on the front surface of the wafer of at least about 0.5 LPDs/cm$^2$. Typically the concentration of LPD's on the front surface of the wafer is greater than about 3 LPDs/cm$^2$, about 6 LPDs/cm$^2$ or even about 8 LPDs/cm$^2$.

A void-rich ingot is typically grown by pulling the crystal at a relatively fast rate (e.g., a pull rate greater than about 0.7 mm/min). However, the formation of vacancies does not depend entirely on the crystal pull rate; the axial temperature gradient in the crystal during the growth process is also significant. See, e.g., U.S. Pat. No. 5,919,302. In general, increasing the rate at which a silicon ingot is pulled increases the density of agglomerated vacancy defects and decreases the size of the defects. For example, the LPD plots set forth in FIG. 2 of wafers sliced from ingots pulled at rates of about 0.85 mm/min and 1.1 mm/min, respectively crystals A and B, indicate the increased density of agglomerated defects resulting from a faster pull rate. In fact, the graph on the left side of FIG. 2 indicates that for LPDs of about 95 nm LSE to about 150 nm LSE the number of LPDs on the A wafer is about one half that on the B wafer; the wafer from crystal A had about 300 LPDs and the wafer from crystal B had about 750 LPDs.

The method of the present invention may be performed on a silicon wafer regardless of the crystallographic orientation (e.g., {100}, {110} or {111}); however, {100} silicon wafers are of primary commercial importance. Typically, {100} silicon wafers are sliced from a {100} silicon ingot nominally along the [100] direction, i.e., the wafers are sliced from the silicon ingot at an angle which varies slightly from the [100] direction (off x-axis and/or off y-axis). A typical acceptable variation from [100] direction is about 30 minutes from the x and y-axes. Silicon wafers sliced slightly off from the [100] direction have less haze after being annealed than wafers sliced precisely along the [100] direction. However, more than about 30 minutes off the [100] direction also increases the haze. Specifically, the smaller the misorientation angle of the silicon wafer with respect to Bragg's angle (i.e., 34° 36' for silicon) the less haze on the post-annealed wafer surface. Thus, the wafer is preferably sliced off the x-axis about 1 minute to about 13 minutes and more preferably about 1 minute to about 8 minutes. With respect to the y-axis, the wafer is preferably sliced off about 1 minute to about 13 minutes and more preferably about 1 minute to about 4 minutes (misorientation from the y-axis has a greater impact on the level of haze than misorientation from the x-axis).

In accordance with the method of the present invention, the thermal treatment comprises heating the wafer and removing a layer of silicon oxide from the front surface of the heated wafer (e.g., the native oxide layer). The removal of the silicon oxide layer is preferably accomplished by heating the front surface of the silicon wafer (e.g., the surface upon which electronic devices are typically fabricated) in an atmosphere consisting essentially of no oxidants (most preferably, the atmosphere is oxidant-free) until the silicon oxide layer (typically about 2 Å to about 30

Å thick) is removed from the surface. Preferably, the wafer is heated to a temperature of at least about 1100° C., more preferably at least about 1150° C. and still more preferably about 1200° C. to about 1250° C. This heating preferably is conducted while exposing the front surface of the silicon wafer to a cleaning gas comprising a $H_2$, HF gas, HCl gas, or a combination thereof. More preferably, the cleaning gas comprises $H_2$, or a combination of $H_2$ and HCl. The concentration of $H_2$ in the cleaning gas may be as little as 3 wt % or less, but as the concentration of $H_2$ in the cleaning gas increases, the faster the native oxide is removed. As such, the cleaning gas most preferably consists essentially of $H_2$ (commercially available at a purity of 99.99 wt %). At temperatures of at least about 1100° C. a cleaning gas consisting essentially of $H_2$ removes the oxide from the wafer surface at a rate of about 1 nm/mm to about 4 nm/mm. Thus, a typical native oxide layer is removed in about 15 seconds to about 60 seconds. Although the native oxide is removed quickly, for simplicity, the wafer is preferably contacted with the cleaning gas during the entire temperature ramp-up.

The thermal treatment of the present invention may be carried out in any number of commercially available rapid thermal annealing ("RTA") or rapid thermal processing ("RTP") furnaces in which the wafer is individually heated by banks of high power lamps. RTA furnaces are capable of rapidly heating a silicon wafer from room temperature to 1100° C. or higher in a few seconds. One such commercially available RTA furnace is the model 2800 furnace available from STEAG AST Electronic GmbH (Dornstadt, Germany). The thermal treatment of the present invention may also be carried out in any number of commercially available epitaxial deposition reactors such as the EPSILON line of epitaxial reactors available from ASM of Bilthoven, Netherlands. Regardless of which type of furnace or reactor is used to perform the thermal treatment, the atmosphere to which the wafer is exposed is preferably flowed through the furnace/reactor at a rate of about 10 liters/min to about 100 liters/min, and more preferably about 15 liters/min to about 20 liters/min. The pressure of the atmosphere in the furnace/reactor may range from sub-atmospheric to super-atmospheric, however, atmospheric pressure is preferred due to cost and safety concerns.

Prior to, or during, the removal of the silicon oxide layer, the wafer is preferably heated at a rate which does not cause slip. More specifically, if the wafer is heated too quickly, a thermal gradient will develop which will create an internal stress sufficient to cause different planes within the wafer to shift relative to each other (i.e., slip). Below about 750° C. to about 800° C., rapid heating of the wafer is not a significant cause of slip. Rapidly heating a wafer between about 800–900° C. to about 1150–1200° C. is likely to cause slip. Lightly doped wafers (e.g., a wafer doped with boron and having a resistivity of about 1 Ω-cm to about 100 Ω-cm) have been found to be particularly susceptible to slip. To avoid this problem, the wafer preferably is heated from about 800–900° C. to the silicon oxide removal temperature at an average rate of about 20° C./sec to about 350° C./sec or less. Preferably, the heating rate is about 3° C./sec to about 5° C./sec (provided that a non-uniform distribution of crystal lattice vacancies necessary for the formation of denuded zone that is substantially free of oxygen precipitates is not being formed; the process is described in greater detail below).

After the silicon oxide is removed from the silicon wafer surface, the $H_2$ in the cleaning ambient removes silicon from the wafer surface at a rate of about 4 nm/min. The removal of silicon is beneficial to the reduction of agglomerated vacancy defects on the wafer surface by decreasing the depth of exposed defects, however, it can also increase the number of defects at the surface by exposing sub-surface agglomerated vacancy defects (e.g., agglomerated defects within about 5 nm to about 500 nm from the surface of the wafer) some of which may not be annihilated by the thermal treatment. For example, exposing a bare 200 mm diameter silicon wafer to 99.99 wt % $H_2$ for about 2 minutes removes about 4 nm of silicon from the surface and assuming a density of agglomerated vacancy defects ranging from about $1 \times 10^5$ defects/cm$^3$ to about $1 \times 10^6$ defects/cm$^3$, the etching will expose tens to hundreds of sub-surface defects. Thus, although the wafer may be exposed to the cleaning gas after the anneal temperature is reached, the flow of cleaning gas is preferably stopped as soon as the anneal temperature is reached to reduce the number of newly exposed defects.

After the flow of the cleaning gas is stopped, the oxide-free front surface of the heated wafer is exposed to a vacuum (e.g., less than about 5 milliTorr) or, preferably, an annealing ambient both of which allow silicon atoms from the surface and sub-surface regions surrounding the agglomerated vacancy defects to migrate or diffuse to the defects and reduce their size. Preferably, the size of the agglomerated vacancy defects is reduced to such an extent that the defects cannot be detected by current laser scatter inspection tools, i.e., less than about 0.095–0.110 μm LSE. The annealing ambient preferably does not substantially etch or remove silicon from the native oxide free front surface (e.g., less than about 0.1 nm/min of silicon is removed from the surface of the silicon wafer). Thus, the annealing ambient is substantially free of $H_2$ (e.g., less than about 0.001 wt %, preferably less than about 0.0001 wt % and most preferably 0 wt %). Additionally, the annealing ambient does not oxidize the surface of the native oxide free front surface because oxide on the surface prevents migration of silicon atoms to the surface. Thus, the annealing ambient is substantially free of oxygen and/or oxygen containing compounds such as $CO_2$ (e.g., less than about 0.001 wt %, preferably less than about 0.0001 wt % and most preferably 0 wt %). The annealing ambient preferably consists essentially of a mono-atomic noble gas selected from the group consisting of He, Ne, Ar, Kr, Xe and mixtures thereof. For cost and availability reasons, Ar is the most preferred mono-atomic noble gas. High purity argon is commercially available at various grades, such as ultra high purity grade (UHP 5) which has a purity of 99.999 wt % and very large scale integration grade (VLSI 5.7+) which has a purity of 99.9995 wt %. Two impurities in commercially available Ar are $H_2O$ and $O_2$ which are believed to cause the formation of spike-like defects (about 0.5 nm high and 0.1 nm wide) on the surface of the silicon wafer. Therefore, the amount of $H_2O$ and $O_2$ impurities is preferably less than about 2 ppm and more preferably less than about 0.5 ppm. Preferably, the annealing ambient is flowed through the RTA at the same rate set forth above for the cleaning gas.

The silicon wafer may be held or soaked at the annealing temperature and exposed to the annealing gas for a duration up to about 5 minutes or longer. In general, the size and concentration of agglomerated vacancy defects decrease as the duration of the soak increases. However, the degree of haze on the surface of the silicon wafer increases with the duration of the soak. Experimental results to date indicate that the best compromise between agglomerated defect size and haze is achieved by maintaining the soak for about 30 seconds to about 2 minutes.

After the soak is completed, the temperature of the wafer surface is decreased to a temperature at which the wafer can be safely handled without imparting damage (e.g., less than about 800° C. to about 900° C.) The rate at which the wafer is cooled is preferably about 20° C./sec to about 35° C./sec. The wafer is preferably cooled while being exposed to the annealing ambient.

Referring to FIG. 1, subjecting the silicon wafer to the thermal treatment of the present invention results in the formation of a stratum 21 extending from the front surface 3 inward a distance (e.g., about 5 nm to about 500 nm), $D_s$, the stratum having a density of agglomerated vacancy defects which is reduced, as compared to the density of such defects throughout the starting material. Between the stratum 21 and the imaginary central plane 7, it is presently believed that the density of agglomerated vacancy defects 20 is unchanged. Specifically, the volume of the wafer between the stratum 21 and the imaginary central plane 7 (i.e., the bulk of the wafer) has a density of agglomerated vacancy defects that is between about $1 \times 10^3$ defects/cm$^3$ and about $1 \times 10^7$ defects/cm$^3$ and typically between about $1 \times 10^5$ defects/cm$^3$ and $1 \times 10^6$ defects/cm$^3$, whereas, the stratum 21 has a density of agglomerated vacancy defects that is preferably less than about 50% of the density of agglomerated vacancy defects in the bulk of the wafer. More preferably the density of agglomerated vacancy defects in the stratum 21 is less than about 30%, 20% or 10% of the density of agglomerated vacancy defects in the wafer bulk. Most preferably, the stratum 21 is substantially free of agglomerated vacancy defects, i.e., the density of agglomerated vacancy defects is less than the detection limit of these defects, which is currently about $1 \times 10^3$ defects/cm$^3$. The extent to which agglomerated vacancy defects on the wafer surface are reduced in size is likewise realized in a decrease in the average concentration of LPDs on the wafer surface—preferably the decrease is by at least about 50%, 70%, 80% or 90%. Thus, an average concentration of LPDs less than about 1 LPD/cm$^2$ is readily attainable. Preferably, the average concentration of LPDs is less than about 0.5 LPDs/cm$^2$, more preferably less than about 0.1 LPDs/cm$^2$ and even more preferably less than about 0.05 LPDs/cm$^2$.

Surprisingly, the foregoing decrease in agglomerated vacancy defects on the surface of the silicon wafer is not accompanied by an unacceptable increase in the haze on the surface of the heat treated silicon wafer. "Haze" is defined as the ratio of scattered light (photons) to incident light, and is considered to depend at least in part on the microroughness of the surface. See, e.g., S. Varharerbeke, T. Futatsuki, R. Messousi and T. Ohmi, The Effects of $H_2$ Annealing on the Si Surface and Its Use in the Study of Roughening During Wet Chemical Cleaning, *Electrochem. Soc. Proceedings*, Vol. 93–8, p. 1170, 1993. An unacceptable increase in haze is defined as increase in haze greater than about 500% compared to the haze on the surface of the silicon wafer prior to being thermally treated. Thus, an acceptable increase in haze is less than about 500% compared to the haze on the surface of the silicon wafer prior to being thermally treated. Preferably, the increase in haze is less than about 350%, more preferably less than about 300%, and still more preferably less than about 200%. The degree of haze is determined using a laser scatter inspection tool which essentially collects scattering data and filters it using a haze processor to separate the haze information from the LPD information. Each inspection tool has its own unique optical design, and as a result, inspecting a wafer with different inspection tools yields different haze values. To scan the entire front surface of the wafer, the SURFSCAN 6220 tool directs the laser beam across the wafer surface as the wafer moves in a direction perpendicular to the direction the beam travels. As such, the orientation of the wafer with respect to the scanning laser beam can influence haze values (all the haze levels disclosed herein were determined with the notch of the wafer oriented at the 6 o'clock position in the loading cassette). In contrast, the newer SURFSCAN SP1 inspection tool has symmetric collection optics and uses a spiral scanning pattern which results in the haze measurement being unaffected by wafer orientation. A surface haze higher than about 1.2 ppm as measured by a SURFSCAN 6220 laser scatter inspection tool limits the ability to detect LPDs less than about 0.2 $\mu$m LSE and is typically considered undesirable. Similarly, a surface haze higher than about 0.2 ppm as measured by a SURFSCAN SP1 laser inspection tool is considered undesirable. For comparison, the haze on the surface of an epitaxial silicon wafer measured by a SURFSCAN 6220 is typically about 0.8 ppm to about 1.1 ppm.

The front surface of a silicon wafer treated in accordance with the method of the present invention has a degree of haze that is less than about 1.2 ppm, preferably less than about 0.7 ppm and more preferably between about 0.5 ppm to about 0.3 ppm as measured by a SURFSCAN 6220 laser scatter inspection tool. As measured by a SURFSCAN SP1 laser scatter inspection tool, the front surface of a silicon wafer treated in accordance with the method of the present invention has a degree of haze that is less than about 0.17 ppm, preferably less than about 0.15 ppm and more preferably between about 0.13 ppm and about 0.10 ppm.

Intrinsic Gettering Single Crystal Silicon Wafers

In addition to reducing the size and concentration of agglomerated vacancy defects on or near the front surface of the silicon wafer (i.e., the foregoing stratum extending inward from the front surface about 5 nm to 500 nm), the present thermal treatment may be used to produce a wafer which is "ideally precipitating"; that is, a wafer which, during essentially any electronic device manufacturing process, will form a denuded zone of sufficient depth and a wafer bulk containing a sufficient density of oxygen precipitates for intrinsic gettering (IG) purposes. Thus, in a preferred embodiment of the process a "template" in the silicon wafer is created which determines or "prints" the manner in which oxygen will precipitate during an electronic device manufacturing process.

In general, the template is created by the increase in the density of crystal lattice vacancies which occurs when a silicon wafer is heated rapidly to a target temperature (e.g., the foregoing anneal temperature) and annealed at that temperature for a relatively short period of time (e.g., the foregoing soak duration) in the presence of an oxidizing or inert atmosphere (e.g., the foregoing annealing gas). Specifically, the silicon wafer is subjected to a temperature in excess of 1150° C., preferably at least 1175° C., more preferably at least about 1200° C., and most preferably between about 1200° C. and 1275° C. The wafer is maintained at this temperature for at least one second, typically for at least several seconds (e.g., at least 3 seconds) or even several tens of seconds and, depending upon the desired characteristics of the wafer and the atmosphere in which the wafer is being annealed, for a period which may range up to about 60 seconds or longer (e.g., a 120 second soak duration).

In general, annealing the wafer in the presence of an inert atmosphere produces a non-uniform vacancy concentration (number density) profile in the wafer with the peak concentration occurring within about 50 to 100 micrometers of the surface which is exposed to the atmosphere and a lesser and relatively uniform concentration in the wafer bulk. If the front and back surfaces of the wafer are exposed to the gas atmosphere during the rapid thermal annealing step, the resulting wafer will have a vacancy concentration (number density) profile which is generally "U-shaped" for a cross-section of the wafer, that is, a maximum concentration will occur within several micrometers of each of the front and back surfaces and a relatively constant and lesser concentration will occur throughout the wafer bulk.

Experimental evidence obtained to date suggests that the atmosphere in which the rapid thermal annealing step is carried out should have an essential absence of oxygen in order for the build-up of vacancies to occur. That is, the atmosphere should have a total absence of oxygen or a partial pressure of oxygen which is insufficient to inject sufficient quantities of silicon self-interstitial atoms which suppress the build-up of vacancy concentrations. The lower limit of oxygen concentration has been determined to be about 500 ppm. It has also been demonstrated that for oxygen concentrations up to about 2000 ppm no increase in vacancy concentration is observed.

In addition to causing the formation of crystal lattice vacancies, the rapid thermal annealing step causes the dissolution of any unstabilized oxygen precipitate nucleation centers which are present in the silicon starting material. These nucleation centers may be formed, for example, during the growth of the single crystal silicon ingot from which the wafer was sliced or as a consequence of some other event in the previous thermal history of the wafer or of the ingot from which the wafer is sliced. Thus, the presence or absence of these nucleation centers in the starting material is not critical, provided these centers are capable of being dissolved during the rapid thermal annealing step.

Crystal lattice vacancies, like metals and other elements, are capable of diffusing through single crystal silicon with the rate of diffusion being temperature dependant. For example, crystal lattice vacancies are relatively mobile at temperatures in the vicinity of the temperature at which the wafer is annealed in the rapid thermal annealing step whereas they are essentially immobile for any commercially practical time period at temperatures of as much as 700° C. Experimental evidence obtained to date suggests that the diffusion rate of vacancies slows considerably at temperatures less than about 700° C. and perhaps as great as 800° C., 900° C., or even 1000° C., the vacancies can be considered to be immobile for any commercially practical time period.

Upon completion of the rapid thermal annealing, the wafer is rapidly cooled through the range of temperatures at which crystal lattice vacancies are relatively mobile in the single crystal silicon. As the temperature of the wafer is decreased through this range of temperatures, the vacancies diffuse to the oxide layer and become annihilated, thus leading to a change in the vacancy concentration profile with the extent of change depending upon the length of time the wafer is maintained at a temperature within this range. If the wafer were held at this temperature within this range for an infinite period of time, the vacancy concentration would once again become substantially uniform throughout the wafer bulk with the concentration being an equilibrium value which is substantially less than the concentration of crystal lattice vacancies immediately upon completion of the heat treatment step. By rapidly cooling the wafer, however, a non-uniform distribution of crystal lattice vacancies can be achieved with the maximum vacancy concentration being at or near the central plane of the wafer and the vacancy concentration decreasing in the direction of the front surface and back surface of the wafer. In general, the average cooling rate within this range of temperatures is at least about 5° C. per second, preferably at least about 20° C. per second, more preferably at least about 50° C. per second, still more preferably at least about 100° C. per second, with cooling rates in the range of about 100° C. to about 200° C. per second being presently most preferred. Once the wafer is cooled to a temperature outside the range of temperatures at which crystal lattice vacancies are relatively mobile in the single crystal silicon, the cooling rate does not appear to significantly influence the precipitating characteristics of the wafer and thus, does not appear to be narrowly critical. Conveniently, the cooling step may be carried out in the same atmosphere in which the heating step is carried out.

After the wafer has been cooled, the wafer is subjected to an oxygen precipitation heat treatment. For example, the wafer may be annealed at a temperature of 800° C. for four hours and then at a temperature of 1000° C. for sixteen hours. Alternatively and preferably, the wafer is loaded into a furnace which is at a temperature of about 800° C. as the first step of an electronic device anufacturing process. When loaded into a furnace at this temperature, the previously rapidly thermal annealed wafer will have separate zones which behave differently with respect to oxygen precipitation. In the high vacancy regions (the wafer bulk), oxygen clusters rapidly as the wafer enters the furnace. By the time the loading temperature is reached, the clustering process is finished and a distribution of clusters is reached which depends only upon the initial concentration of vacancies. In the low vacancy regions (near the wafer surfaces), the wafer behaves like a normal wafer which lacks pre-existing oxygen precipitate nucleation centers; that is, oxygen clustering is not observed. As the temperature is increased above 800° C. or if the temperature remains constant, the clusters in the vacancy rich zone grow into precipitates, whereas in the vacancy lean zone nothing happens. By dividing the wafer into various zones of vacancy concentration, a template is effectively created through which is written an oxygen precipitate pattern.

Figure 7:
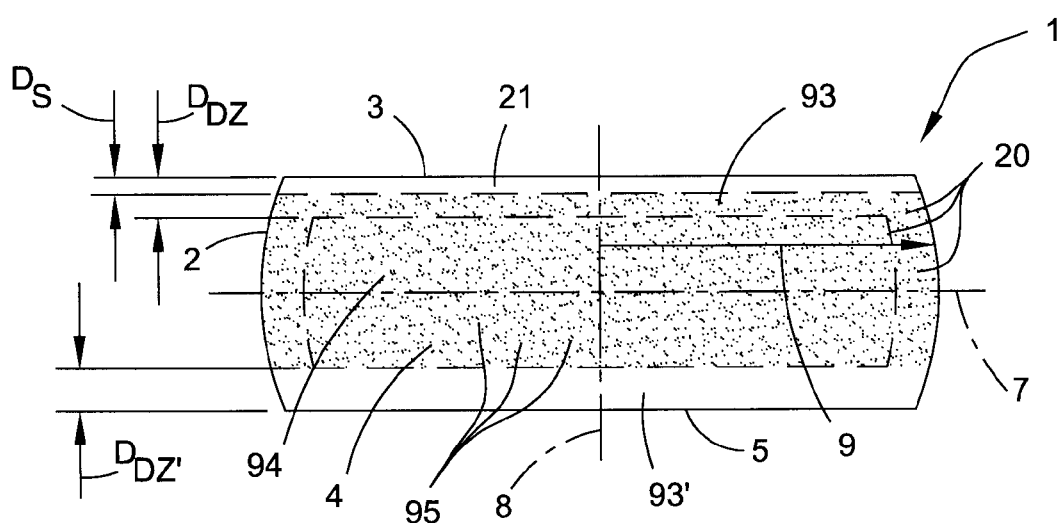
FIG. 7 shows an oxygen precipitate profile of a wafer which may be prepared in accordance with a preferred embodiment of the present invention.

FIG. 7 shows one such oxygen precipitate distribution which may be formed by heat-treating a wafer prepared in accordance with this invention. In this particular embodiment, the wafer substrate 4 (with or without an epitaxial layer deposited on front surface 3) is characterized by regions 93 and 93' ("denuded zones") which are free of oxygen precipitates 95. These zones extend from the front surface 3 and back surface 5 to a depth of $D_{dz}$ and $D_{dz}'$, respectively. Preferably, $D_{dz}$ and $D_{dz}'$ are each from about 1 µm to about 100 µm, and more preferably from about 50 µm to about 100 µm. Between the oxygen precipitate-free regions 93 and 93', there is a region 94 which contains a substantially uniform concentration of oxygen precipitates. It should be recognized that the purpose of FIG. 7 is to help acquaint those skilled in the art with this invention by illustrating merely one embodiment of this invention. This invention is not limited to that embodiment. For example, this invention may also be used to form a wafer having only one denuded zone 93 (instead of two denuded zones 93 and 93').

The concentration of oxygen precipitates in region 94 is primarily a function of the heating step and secondarily a function of the cooling rate. In general, the concentration of oxygen precipitates increases with increasing temperature and increasing annealing times in the heating step with precipitate densities in the range of about $1 \times 10^7$ to about $5 \times 10^{10}$ precipitates/cm$^3$ being routinely obtained.

The depth $D_{dz}$, $D_{dz}'$ from the front and back surfaces of oxygen precipitate-free material (denuded) zones 93 and 93' is primarily a function of the cooling rate through the temperature range at which crystal lattice vacancies are relatively mobile in silicon. In general, the depth $D_{dz}$, $D_{dz}'$ decreases with decreasing cooling rates with denuded zone depths of at least about 20, 30, 40, 50, 70 or even 100 μm being attainable. Significantly, the depth of the denuded zone is essentially independent of the details of the electronic device manufacturing process and, in addition, does not depend upon the out-diffusion of oxygen as is conventionally practiced.

While the heat treatments employed in this process may result in the out-diffusion of a small amount of oxygen from the surface of the front and back surfaces of the wafer, the wafer bulk at depths of at least 5 micrometers from the wafer surface will have a substantially uniform oxygen concentration. In this context, substantially uniform oxygen concentration shall mean a variance in the oxygen concentration of no more than about 50%, preferably no more than about 20% and most preferably no more than about 10%. Nevertheless, a denuded zone of substantially greater depth can be formed as a consequence of the cooling step which caused the formation of a non-uniform distribution of crystal lattice vacancies in the wafer. Thus, the wafer of the present invention will have a denuded zone and a substantially uniform oxygen concentration as a function of depth from the silicon surface. For example, the wafer will have a uniform concentration of oxygen from the center of the wafer to regions of the wafer which are within about 15 microns of the silicon surface, more preferably from the center of the silicon to regions of the wafer which are within about 10 microns of the silicon surface, even more preferably from the center of the silicon to regions of the wafer which are within about 5 microns of the silicon surface and most preferably from the center of the silicon to regions of the wafer which are within 3 microns of the silicon surface.

The creation of denuded zones in accordance with the present invention is described in PCT Application No. WO/98/38675 published on Sep. 3, 1998 and incorporated herein by reference for all purposes.

Epitaxial Single Crystal Silicon Wafers

In addition to reducing the size and concentration of agglomerated vacancy defects on the front surface of the silicon wafer, the present thermal treatment may be used in conjunction with the growth of an epitaxial silicon layer on the front surface of the silicon wafer to provide several benefits including a further reduction in the size and concentration of the agglomerated vacancy defects, a further reduction in haze and, if desired, an epitaxial layer with a different resistivity to the silicon wafer on which the layer is deposited (e.g., a P+-silicon layer having a resistivity of about 0.03 Ω-cm to about 0.01 Ω-cm on a P--silicon wafer). An epitaxial deposition process is readily incorporated with the H$_2$/Ar annealing sequence set forth above because the removal of the native oxide layer prior to further steps is common to both processes. As such, in accordance with the method of the present invention, depositing the epitaxial silicon layer on the front surface of the silicon wafer may occur either before or after the Ar-soak portion of the H$_2$/Ar annealing sequence. Regardless of when the epitaxial deposition occurs, it is desirable to carry out the H$_2$/Ar annealing sequence in an epitaxial reaction chamber rather than a rapid thermal annealer or a rapid thermal processor, provided the heating and cooling rates required by the process of the present invention can be achieved.

The removal of the native oxide layer from the front surface of the silicon wafer is accomplished in accordance with the above-described manner. Following the removal of the native oxide layer or the Ar-soak and prior to the cool-down, the temperature in the reaction chamber is adjusted to between about 600° C. and about 1200° C. preferably at least about 1100° C. and more preferably at least about 1150° C. The front surface of the wafer is then contacted with a silicon containing source gas to deposit the epitaxial layer onto the front surface. Preferably, the surface is contacted with the source gas less than 30 seconds after the native oxide is removed or the Ar-soak is completed, more preferably within about 20 seconds, and most preferably within about 10 seconds. Waiting to initiate silicon deposition for about 10 seconds after removal of the silicon oxide layer allows the temperature of the wafer to stabilize and become uniform.

The epitaxial deposition preferably is carried out by chemical vapor deposition. Generally speaking, chemical vapor deposition involves exposing the surface of the wafer to an atmosphere comprising silicon in an epitaxial deposition reactor, e.g., an EPI CENTURA reactor manufactured by Applied Materials of Santa Clara, Calif., U.S.A, or the EPSILON line of epitaxial reactors available from ASM of Bilthoven, Netherlands. In a preferred embodiment of this invention, the surface of the wafer is exposed to an atmosphere comprising a volatile gas comprising silicon (e.g., $SiCl_4$, $SiHCl_3$, $SiH_2Cl_2$, $SiH_3Cl$, or $SiH_4$). The atmosphere also preferably contains a carrier gas (most preferably $H_2$). In one embodiment, the source of silicon during the epitaxial deposition is $SiH_2Cl_2$ or $SiH_4$. If $SiH_2Cl_2$ is used, the reactor pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air leaking into the reactor chamber is lessened.

During the epitaxial deposition, the temperature of the wafer surface preferably is maintained at a temperature sufficient to prevent the atmosphere comprising silicon from depositing polycrystalline silicon onto the surface. Generally, the temperature of the surface during this period preferably is at least about 900° C. More preferably, the temperature of the surface is maintained at from about 1050° C. to about 1150° C. Most preferably, the temperature of the surface is maintained at the silicon oxide removal temperature.

The rate of growth of the epitaxial layer is preferably about 3.5 μm/min to about 4.0 μm/min when the deposition is conducted under atmospheric pressure. This may be achieved, for example, by using an atmosphere consisting essentially of about 2.5 mole % $SiHCl_3$ and about 97.5 mole % $H_2$ at a temperature of about 1050° C. to 1150° C. at a flow rate of about 1 liter/minute to about 20 liters/minute.

Typically, COPs on a wafer surface are eliminated by using an epitaxial silicon layer thickness of at least about 0.1 μm. Preferably, the epitaxial layer has a thickness of at least about 0.1 μm and less than about 2 μm. More preferably, the epitaxial layer has a thickness of from about 0.25 μm to about 1 μm, and most preferably from about 0.5 μm to about 1 μm. It should be noted that where an epitaxial layer is used for a purpose in addition to eliminating COPs, such a purpose may require an epitaxial layer thickness which is greater than the preferred thickness used to eliminate COPs.

For example, if the epitaxial layer is used to impart electrical properties to the wafer surface in addition to eliminating COPs, the thickness of the epitaxial layer may be up to about 200 μm. Typically, the thickness of an epitaxial layer deposited to impart electrical properties is about 1 μm to about 100 μm, and preferably about 2 μm to about 30 μm. More preferably, the additional desired effect is achieved with a minimum thickness (e.g., about 3 μm).

Preferably, the thickness of the epitaxial layer is uniform. The thickness uniformity over the entire surface of a wafer is preferably less than about 1% to about 5% of the target thickness. Thus, if the target thickness is about 3 μm the thickness variation for the entire wafer surface is preferably less than about 30 μm to about 150 nm. More preferably, the thickness variation for the entire wafer surface is less than about 30 nm to about 100 nm. The thickness of the epitaxial layer is typically measured using Fourier Transform Infra-Red spectrometry (FTIR) at several points over the wafer surface. For example, FTIR may be used to measure the thickness of the epitaxial layer near the center of the wafer and at 4 points near the circumferential edge (e.g., the points being about 90° apart and inward about 5–10 mm of the circumferential edge).

If the intended use of the wafer requires that the epitaxial layer include a dopant, the atmosphere comprising silicon also preferably contains the dopant. For example, it is often preferable for the epitaxial layer to contain boron. Such a layer may be prepared by, for example, including $B_2H_6$ in the atmosphere during the deposition. The mole fraction of $B_2H_6$ in the atmosphere needed to obtain the desired properties (e.g., resistivity) will depend on several factors, such as the amount of boron out-diffusion from the particular substrate during the epitaxial deposition, the quantity of P-type dopants and N-type dopants that are present in the reactor and substrate as contaminants, and the reactor pressure and temperature. Similar to the wafer substrate, the concentration of dopant in the epitaxial layer may be controlled to yield a wide range of resistivities. For example, an atmosphere containing about 0.03 ppm of $B_2H_6$ (i.e., about 0.03 mole of $B_2H_6$ per 1,000,000 moles of total gas) at a temperature of about 1125° C. and a pressure of about 1 atm. has been used to obtain an epitaxial layer having a resistivity of about 10 Ω-cm.

Once an epitaxial layer having the desired thickness has been formed, the atmosphere comprising silicon preferably is purged from the reaction chamber with the mono-atomic noble gas used during the $H_2/Ar$ annealing sequence. Afterward, the wafer preferably is cooled to a temperature at which it can be handled without imparting damage (typically no greater than about 800–900° C., however, some apparatus can handle wafers at temperatures substantially higher than about 900° C. and is then removed from the epitaxial deposition reactor.

Silicon on Insulator Structures

In general, the SOI structure comprises a base layer, a device layer and an insulating layer (typically an oxide layer), between the base layer and the device layer. Generally, the device layer is between 0.01 and 50 μm thick. Such a structure may be prepared using various techniques known in the art. For example, wafer thinning techniques may be used such as back grind SOI (BGSOI) and back etch SOI (i.e., BESOI), wherein a donor silicon wafer is bound to a handle wafer (i.e., the base layer coincides with the handle wafer) and then ground or etched away until only a thin layer of silicon on the handle wafer remains (i.e., the device layer comprises the remaining portion of the donor wafer)(see, e.g., U.S. Pat. No. 5,189,500). Rather than thinning the donor wafer, which is time consuming and wasteful, other techniques known in the art separate or cleave the device layer from the donor wafer. The cleaving process is typically accomplished by using a donor wafer that has a layer which is susceptible to separation beneath what is to be the device layer of the SOI structure. The separation layer may be, for example, a porous silicon layer (ELTRAN), a silicon germanium layer (NANOCLEAVE) or a layer of implanted hydrogen (SMARTCUT)(see, e.g., U.S. Pat. Nos. 6,335, 264; 6,350,703; 6,350,702; and 6,352,909). This process is substantially quicker and the donor wafer may be reused to produce additional device layers (typically, the donor wafer can produce 2 or 3 device layers). Alternatively, a single wafer may be used wherein molecular oxygen ions ($O_2^+$) or atomic oxygen ions ($O^+$) are implanted below the surface of the wafer to form an oxide layer. This process is generally referred to as SIMOX (i.e., separation by implantation of oxygen; see, e.g., U.S. Pat. No. 5,436,175 and *Plasma Immersion Ion Implantation For Semiconductor Processing*, Materials Chemistry and Physics 46 (1996) 132–139). Such a process is considered advantageous because it acts to reduce the number of silicon wafers which are consumed, as compared to the more conventional wafer thinning and cleaving processes, in the preparation of a SOI structure.

In accordance with the present invention, a thermal treatment may be used to reduce the size and concentration of agglomerated vacancy defects on a surface of one or more silicon wafers (i.e., the donor wafer and/or the handle wafer) used to manufacture a silicon on insulator (SOI) structure without a significant increase in the level of haze. Specifically, the thermal treatment may be carried out on the front surface of the handle wafer and/or the front surface of the donor wafer prior to the SOI bonding or oxygen implantation process being performed. Additionally, the thermal treatment of the present invention may also be performed on the exposed, or front, surface of the device layer after the SOI structure has been completely assembled.

In addition to having the size and concentration of agglomerated vacancy defects at the surface reduced, a SOI structure having an "ideal precipitating" layer may be obtained by subjecting the handle wafer to an ideal precipitating wafer process (see, *Intrinsic Gettering Single Crystal Silicon Wafers*, supra; and U.S. Pat. No. 6,236,104). For example, if the SOI structure is created by bonding a handle wafer and a donor wafer, it is desirable to create an ideal precipitating layer in the handle wafer prior to bonding operation because metals which become mobile during the bonding operation can be intrinsically gettered. The ideal precipitating layer may also be created in the completed SOI bonded handle wafer-device layer structure.

Alternatively, a SOI structure having an ideal precipitating layer may be produced using a SIMOX process in which a dielectric layer such as silicon dioxide or silicon nitride is implanted beneath the surface of the wafer and an epitaxial layer is deposited on the handle wafer. Preferably, molecular oxygen ions ($O_2^+$) or atomic oxygen ions ($O^+$) are implanted below the surface of the wafer to form an oxide layer approximately about 0.01 μm to about 0.5 μm beneath the surface of the wafer, the oxide layer having a thickness of from about 0.05 μm to about 0.5 μm.

Generally, the implanted wafer will be subjected to a thermal anneal to repair damage to the device layer and to redistribute the implanted oxygen as it chemically bonds with the silicon to form a silicon dioxide ($SiO_2$) layer. The temperature of the thermal anneal is typically from about 1100° C. to about 1400° C., and preferably from about 1300° C. to about 1350° C., and more preferably about 1300° C. The duration of the thermal anneal is typically about 0.1 hour to about 12 hours, more preferably about 6 hours, and may vary depending on the desired characteristics of both the device layer and the dielectric layer.

The precise order in which the various steps are performed may be varied without departing from the scope of the present invention. For example, according to one embodiment of the present invention, an epitaxial layer is first deposited on the surface of a silicon wafer to form an epitaxial wafer. The epitaxial wafer is then subjected to an ideal precipitating heat-treatment to produce an ideal precipitating epitaxial wafer. The ideal precipitating epitaxial wafer is then subjected to an ion implantation process and a thermal anneal to cause the formation of a dielectric layer between the epitaxial layer and the bulk layer to produce a silicon on oxide (SOI) structure wherein the device layer comprises an epitaxial layer, and the handle layer comprises a non-uniform distribution of vacancies.

In another embodiment of the present invention, a silicon wafer is first subjected to an ideal precipitating heat-treatment to produce an ideal precipitating wafer. An epitaxial layer is then deposited on the surface of the ideal precipitating wafer prior to producing the ideal precipitating layer. The ideal precipitating epitaxial wafer is then subjected to an ion implantation process and a thermal anneal to cause the formation of a dielectric layer between the epitaxial layer and the bulk layer to produce a SOI structure wherein the device layer comprises an epitaxial layer, and the handle layer comprises a non-uniform distribution of vacancies.

In still another embodiment, a silicon wafer is subjected to an ion implantation process to produce a SOI structure having a device layer, a handle layer, and a dielectric layer separating the device layer and the handle layer. The SOI wafer is then subjected to an ideal precipitation heat treatment to produce an ideal precipitating SOI wafer. An epitaxial layer is then deposited on the surface of the device layer to produce a SOI structure wherein the device layer comprises an epitaxial layer, and the handle layer comprises a non-uniform distribution of vacancies. Alternatively, the SOI structure may be subjected to the ideal precipitating heat treatment prior to the deposition of the epitaxial layer.

It should be noted that in each embodiment of the present invention, the ideal precipitation heat-treatment may optionally include an oxygen precipitation and stabilization treatment as described above. In particular, it is preferred that the ideal precipitation heat treatment be followed by an oxygen precipitation and stabilization treatment prior to subjecting the ideal precipitating wafer to subsequent epitaxial deposition and/or ion implantation step(s). In addition, it should be noted that the thermal anneal following the ion implantation may be performed prior to or after subsequent ideal precipitating heat-treatment and/or epitaxial deposition step(s) without departing from the scope of the present invention.

EXAMPLES

Several experiments were performed to determine the efficacy of the method of the present invention. For all the experiments, wafers having a nominal diameter of about 200 mm were prepared from two P$^-$-silicon ingots designated as crystals A and B. The crystal production parameters and wafer properties are set forth in Table 1.

TABLE 1

| Crystal | Crystal pull rate (mm/min) | Resistivity (ohm-cm) | Oxygen concentration (ppma) | Off X-axis | Off Y-axis | Off[100] direction (determined with X-ray spectrometer) |
|---|---|---|---|---|---|---|
| A | 0.85 | 9.8 | 12 | 8' | 2' | 8.2' |
| B | 1.1 | 10.8 | 15.3 | 8' | 12' | 14.4' |

FIG. 2 contains maps of pre-annealed wafers from crystals A and B. As is readily visible on the maps, the faster pull rate of the B crystal resulted in a significantly higher concentration of agglomerated vacancy defects than in the A crystal. FIG. 2 also contains two graphs which quantify the images of the wafers. The graph on the left indicates the number of defects by size across the surfaces of the wafers as a function of defect size. The vast majority of defect counts detected on wafers by the SURFSCAN SP1 before and after annealing were located in 0.095 μm LSE-0.25 μm LSE size range. For this reason, the analysis of the LPD counts were limited to this particle size range. The graph on the right indicates the density of LPDs as a function of distance from the center of the wafer.

Example 1

Evaluating the Reduction of COPs

Three different processes were compared—a process in which an H$_2$ atmosphere or ambient was throughout the entire heat treatment, a process in which an Ar atmosphere used throughout the entire heat treatment and a process of the present invention in which sequential H$_2$ and Ar atmospheres were used during the heat treatment. The temperature profile was identical for each process—the average heating and cooling rates were about 5° C./sec, the anneal temperature was about 1200° C. and the duration of the soak was about 2 minutes.

Annealing the silicon wafers using the process in which only Ar gas was used resulted in spike-like defects on the wafer surface. The spike-like defects produced inflated LPD counts and are not reported herein. For the wafers annealed in the H$_2$ and the sequential H$_2$/Ar atmospheres, the pre- and post-anneal defect sites were determined with a SURFSCAN SP1. The LPDs were mapped and matched. The results are summarized in Table 2 and graphically represented in FIG. 3.

TABLE 2

| Crystal | Annealing Process | Pre-anneal LPD counts | Post-anneal LPD counts | Common LPD counts | Added LPD counts |
|---|---|---|---|---|---|
| A | H$_2$ | 1143 | 356 | 5 | 348 |
| B | H$_2$ | 1769 | 715 | 561 | 155 |
| A | H$_2$/Ar | 1106 | 140 | 75 | 65 |
| B | H$_2$/Ar | 2680 | 226 | 111 | 115 |

Figure 3:
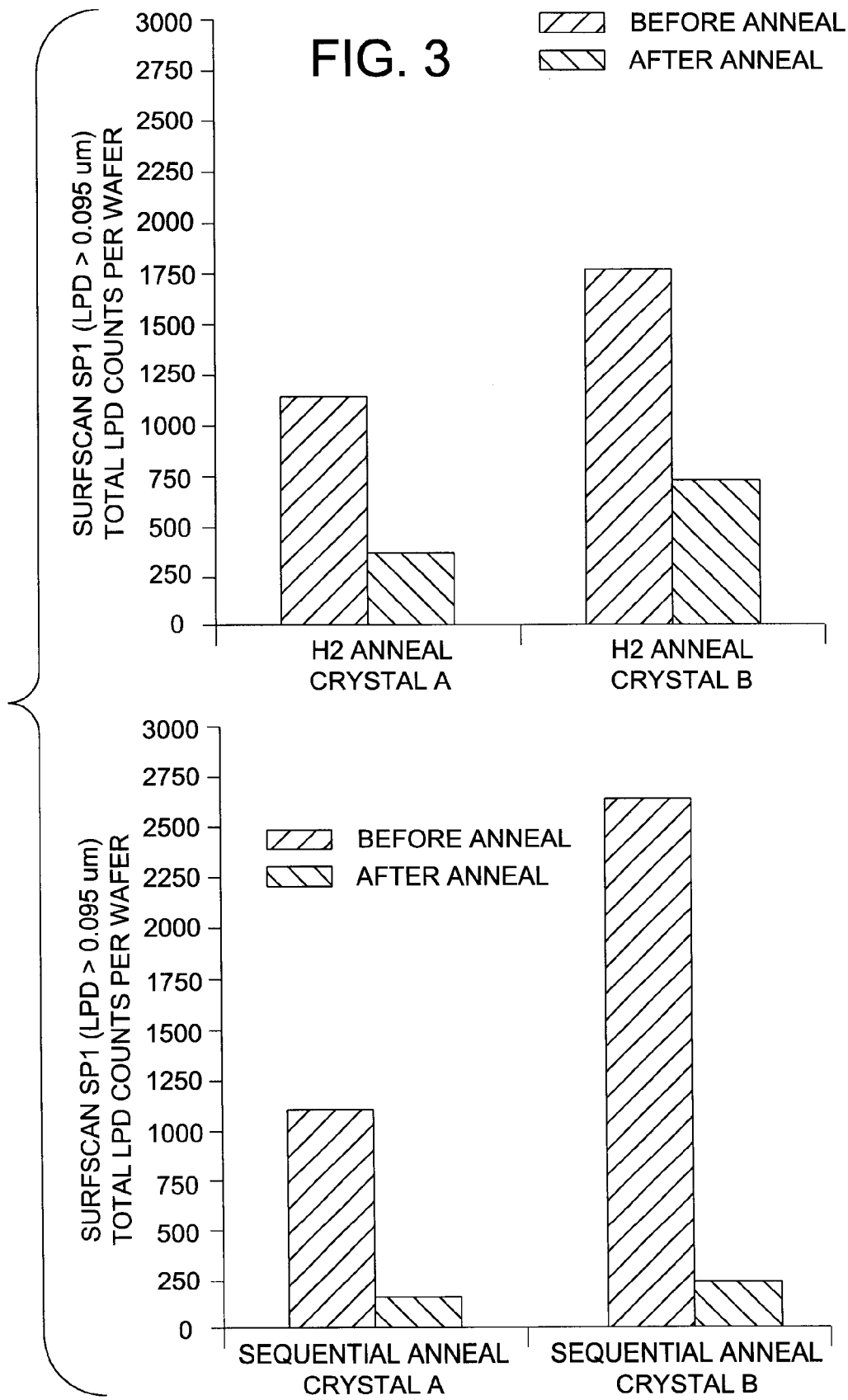
FIG. 3 contains two graphs which indicate the number of LPDs exceeding about 0.95 µm LSE on the surface of wafers sliced from two different crystals before and after being annealed in different atmospheres (an H$_2$ atmosphere and a sequential H$_2$/Ar atmosphere).

The LPD counts on the wafers produced from crystal A after the H$_2$ and H$_2$/Ar heat treatments were reduced by about 69% and 87%, respectively (left graph of FIG. 3). The LPD counts on the wafers produced from crystal B after the H$_2$ and H$_2$/Ar heat treatments were by about 60% and 92%, respectively (right graph of FIG. 3). The foregoing results suggest that the method of the present invention is particularly well suited to treat wafers with a relatively high concentration of relatively small agglomerated vacancy defects. This allows for silicon ingots to be pulled faster thereby increasing throughput and reducing the cost of the silicon wafers.

The wafers annealed in $H_2$ ambient had more added counts than those annealed in the $H_2/Ar$ sequence. It is presently believed that the added counts are post-anneal COPs that were originally located below the surface of the polished silicon wafers which were uncovered by $H_2$ etching of silicon from the surface of the silicon wafers.

Example 2

Evaluating Silicon Wafer Surface Structure and Haze

Figure 4:
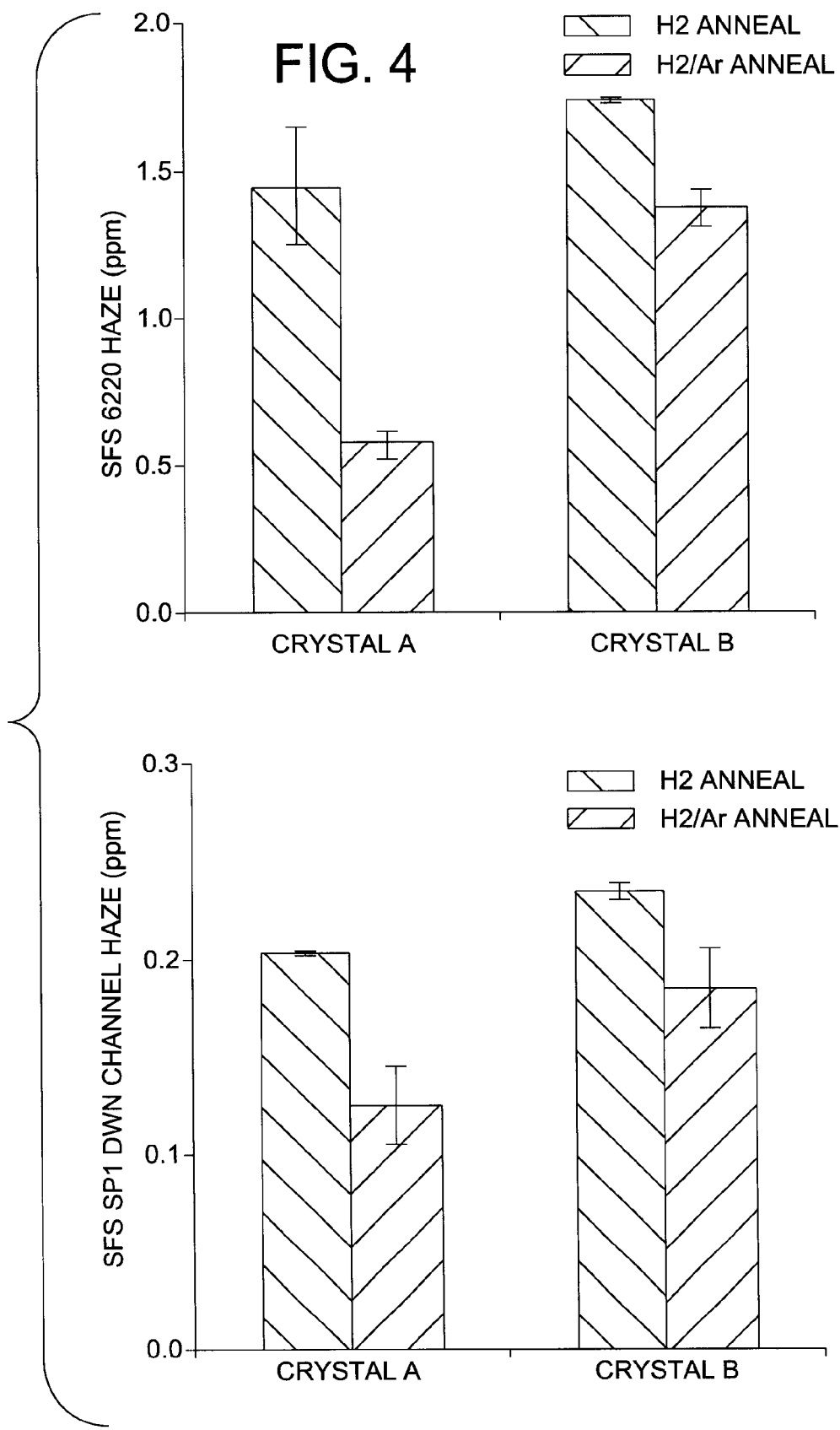
FIG. 4 contains two graphs which indicate the degree of haze on the surface of wafers sliced from two different crystals after being annealed in different atmospheres (an H$_2$ atmosphere and a sequential H$_2$/Ar atmosphere). The graph on the left contains the haze levels for the wafers as determined using a SURFSCAN 6220. The graph on the right contains the haze levels for the wafers as determined using a SURFSCAN SP1.

The haze on the surface of wafers from crystals A and B annealed in the $H_2$, Ar and the sequential $H_2/Ar$ ambients was determined using the SURFSCAN 6220 and the SURF-SCAN SP1 laser scatter inspection tools. The spike-like defects on the wafers annealed in the Ar ambient resulted in an extremely high level of haze, about 4.5 ppm as determined with a SURFSCAN 6220. Referring to the left graph of FIG. 4, wafers from crystals A and B annealed in $H_2$ ambient had about 1.45 ppm and about 1.75 ppm of haze, respectively, as determined with the SURFSCAN 6220. Whereas the wafers from crystal A and B annealed in the $H_2/Ar$ ambient had about 0.60 ppm and about 1.4 ppm of haze, respectively, as determined with the SURFSCAN 6220. Referring to the right graph of FIG. 4, wafers from crystals A and B annealed in $H_2$ ambient had about 0.21 ppm and about 0.24 ppm of haze, respectively, as determined with the SURFSCAN SP1. Whereas the wafers from crystal A and B annealed in the $H_2/Ar$ ambient had about 0.15 ppm and about 0.18 ppm of haze, respectively, as determined with the SURFSCAN SP1.

The foregoing haze data also indicates that the wafers from crystal B have a higher degree of haze compared to the wafers from crystal A. As described above, it is presently believed that as the misorientation from the [100] direction increases the degree of haze on the wafer surface increases. The haze data also indicates that misorientation from the y-axis more significantly affects the degree of haze than misorientation from the x-axis. Specifically, the wafers from crystal B which were cut with a greater off y-axis angle compared to wafers prepared from crystal A had a higher surface haze of about 1.33 ppm after the $H_2/Ar$ annealing sequence as determined with the SURFSCAN 6220.

Example 3

Evaluating the Effects of Heat Treatment Duration

Figure 5:
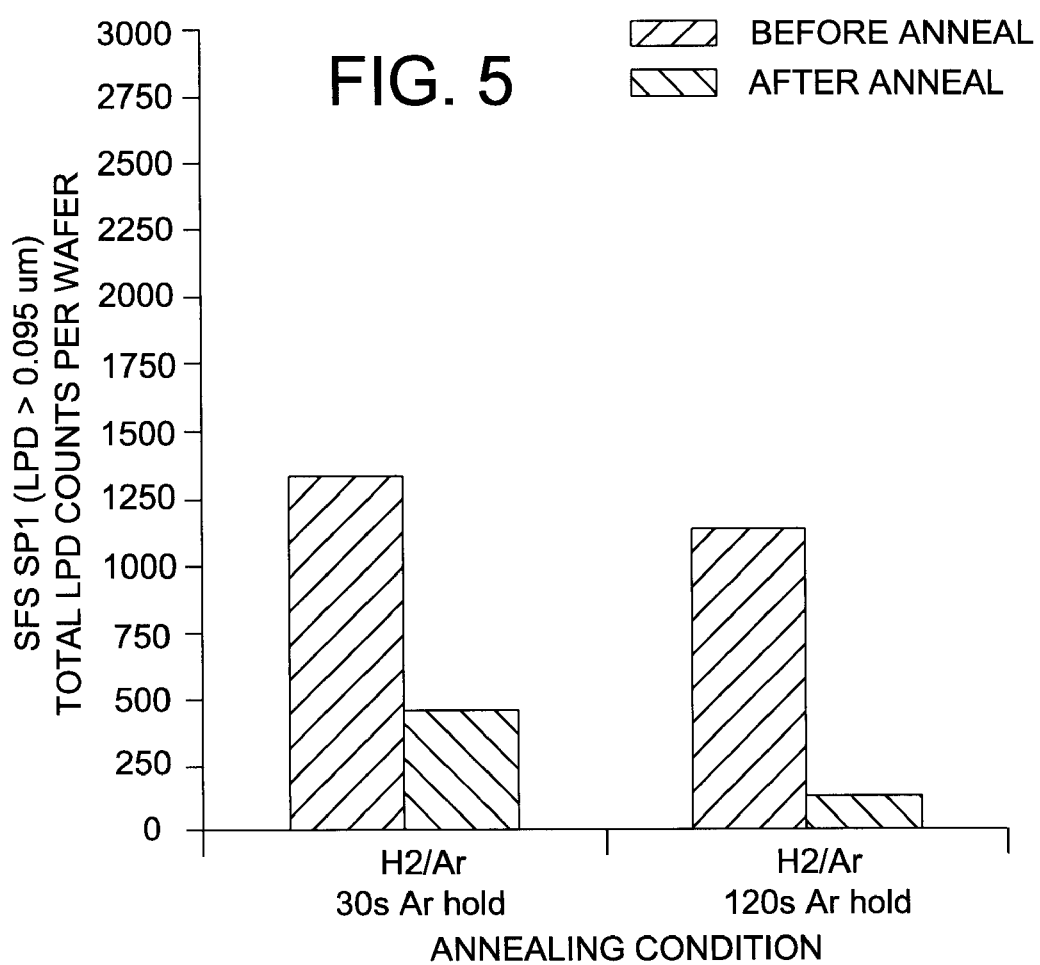
FIG. 5 is a graph comparing the number of LPDs exceeding about 0.095 µm LSE eliminated from the surface of wafers as a function of duration of the soak in Ar atmosphere.

Shortening the duration of the high temperature soak reduces the cost of the $H_2/Ar$ sequential annealing process. For this experiment three Ar-soak durations were evaluated—about 30 seconds, about 60 seconds and about 120 seconds. FIG. 5 is a graph comparing the reduction of agglomerated vacancy defects for the 30 second soak and the 120 second soak. Decreasing the duration from about 120 seconds to about 30 seconds decreased the annealing efficiency for agglomerated vacancy defects from 87.3% to 67.5%, respectively. However, the annealing efficiency for the $H_2/Ar$ sequential anneal with a 30 second high temperature soak is comparable to a 2 minute high temperature soak in an $H_2$ ambient (Compare left graph of FIG. 3 and FIG. 5).

Figure 6:
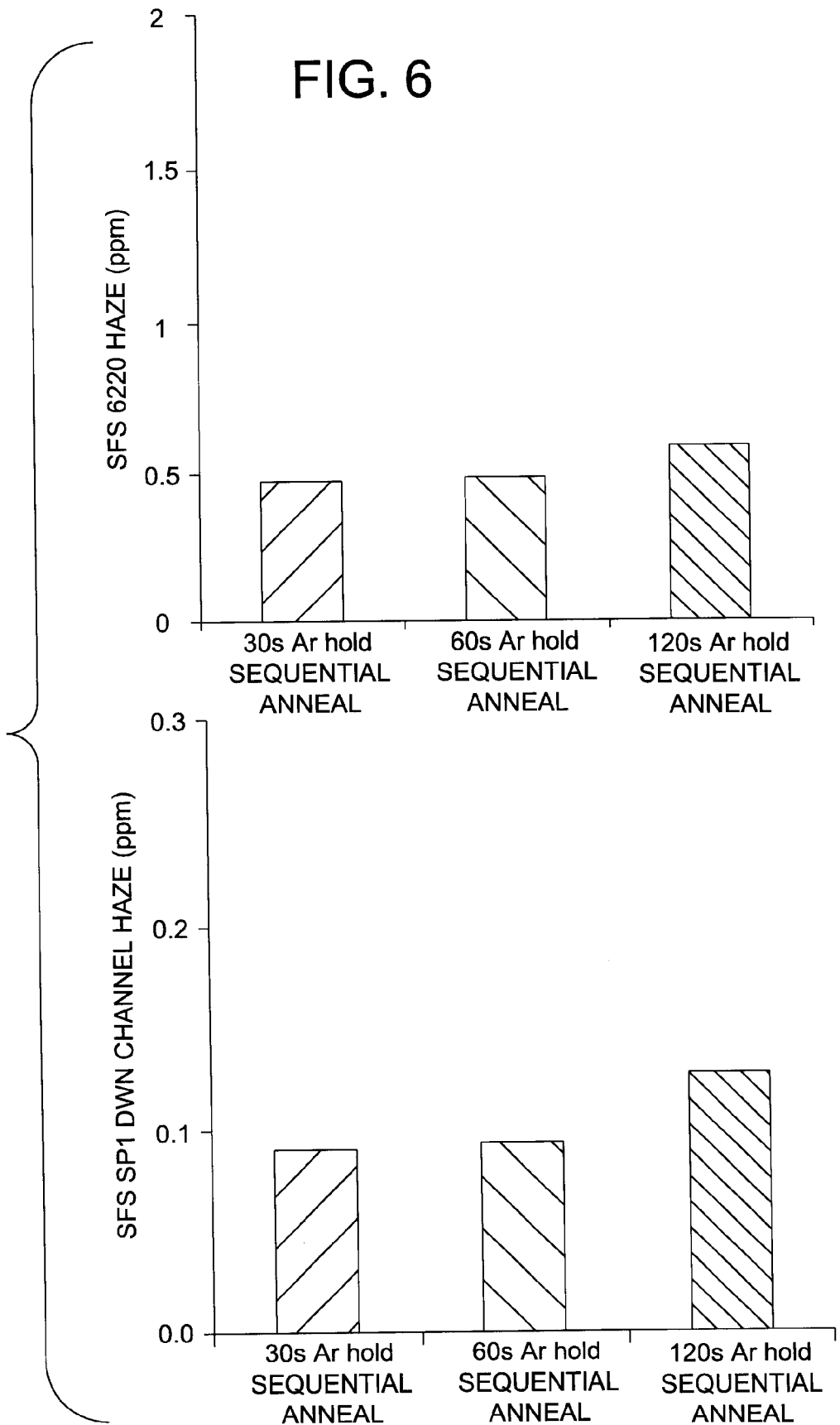
FIG. 6 contains two graphs comparing haze on the surface of wafers as function of duration of the soak in Ar atmosphere. The graph on the left contains the haze readings as determined using a SURFSCAN 6220. The graph on the right contains the haze readings as determined using a SURFSCAN SP1.

The relationship between the degree of surface haze and the duration of the high temperature soak during the $H_2/Ar$ sequential anneal was also investigated. The haze data measured using the SURFSCAN 6220 is presented in the left graph of FIG. 6 and the right graph contains the haze data measured using the SURFSCAN SP1. As expected, the lowest amount of haze developed during a 30 second high temperature soak. The results also indicate, however, that even for soak durations up to 120 seconds, the Ar annealing gas has a minimal impact on the surface haze (the haze produced during the 120 second soak is nearly as low as that on a non-annealed polished wafer (e.g., about 0.2–0.5 ppm as determined with the SURFSCAN 6220).

Visual Detection of Agglomerated Defects

Agglomerated defects may be detected by techniques other than laser scattering; however, laser scattering techniques typically have a lower defect density detection limit. For example, flow pattern defects, or D-defects, are typically detected by preferentially etching the single crystal silicon sample in a Secco etch solution for about 30 minutes, and then subjecting the sample to microscopic inspection. (see, e.g., H. Yamagishi et al., Semicond. Sci. Technol. 7, A135 (1992)). Although standard for the detection of agglomerated vacancy defects, this process may also be used to detect agglomerated interstitial defects. When this technique is used, such defects appear as large pits on the surface of the sample when present.

Additionally, agglomerated intrinsic point defects may be visually detected by decorating these defects with a metal capable of diffusing into the single crystal silicon matrix upon the application of heat. Specifically, single crystal silicon samples, such as wafers, slugs or slabs, may be visually inspected for the presence of such defects by first coating a surface of the sample with a composition containing a metal capable of decorating these defects, such as a concentrated solution of copper nitrate. The coated sample is then heated to a temperature between about 900° C. and about 1000° C. for about 5 minutes to about 15 minutes in order to diffuse the metal into the sample. The heat-treated sample is then cooled to room temperature, thus causing the metal to become critically supersaturated and precipitate at sites within the sample matrix at which defects are present.

After cooling, the sample is first subjected to a non-defect delineating etch, in order to remove surface residue and precipitants, by treating the sample with a bright etch solution for about 8 to about 12 minutes. A typical bright etch solution comprises about 55 percent nitric acid (70% solution by weight), about 20 percent hydrofluoric acid (49% solution by weight), and about 25 percent hydrochloric acid (concentrated solution).

The sample is then rinsed with deionized water and subjected to a second etching step by immersing the sample in, or treating it with, a Secco or Wright etch solution for about 35 to about 55 minutes. Typically, the sample will be etched using a Secco etch solution comprising about a 1:2 ratio of 0.15 M potassium dichromate and hydrofluoric acid (49% solution by weight). This etching step acts to reveal, or delineate, agglomerated defects which may be present.

In general, regions of interstitial and vacancy dominated material free of agglomerated defects can be distinguished from each other and from material containing agglomerated defects by the copper decoration technique described above. Regions of defect-free interstitial dominated material contain no decorated features revealed by the etching whereas regions of defect-free vacancy dominated material (prior to a high-temperature oxygen nuclei dissolution treatment as described above) contain small etch pits due to copper decoration of the oxygen nuclei.

In view of the above, it will be seen that the several objects of the invention are achieved. As various changes could be made in the above compositions and processes without departing from the scope of the invention, it is intended that all matter contained in the above description be interpreted as illustrative and not in a limiting sense.

With reference to the use of the word(s) "comprise" or "comprises" or "comprising" in the above description and/or in the following claims, Applicants note that unless the context requires otherwise, those words are used on the basis and clear understanding that they are to be interpreted inclusively, rather than exclusively, and that Applicants intend for each of those words to be so interpreted in construing the above description and/or the following claims.

We claim:

1. A single crystal silicon wafer having two generally parallel surfaces, one of which is the front surface of the wafer and the other of which is the back surface of the wafer, an imaginary central plane between the front and back surfaces, a circumferential edge joining the front and back surfaces, and agglomerated vacancy defects dispersed throughout the volume of the wafer, the wafer being characterized in that:

the silicon wafer has a density of agglomerated vacancy defects of between about $1 \times 10^3$ defects/cm$^3$ and about $1 \times 10^7$ defects/cm$^3$ between the imaginary central plane and a stratum extending from the front surface inward a distance $D_s$, and a density of agglomerated vacancy defects in the stratum that is less than the density of agglomerated vacancy defects between the imaginary central plane and the stratum;

the front surface of the silicon wafer has a concentration of light point defects that is less than about 3 LPDs/cm$^2$; and the front surface of the silicon wafer has a degree of haze which allows the detection of LPDs less than about 0.2 $\mu$m LSE.

2. The single crystal silicon wafer as set forth in claim 1 wherein the density of agglomerated vacancy defects between the imaginary central plane and the stratum is between about $1 \times 10^5$ defects/cm$^3$ and about $1 \times 10^6$ defects/cm$^3$.

3. The single crystal silicon wafer as set forth in claim 2 wherein the density of agglomerated vacancy defects in the stratum is less than about 50% of the density of agglomerated vacancy defects between the imaginary central plane and the stratum.

4. The single crystal silicon wafer as set forth in claim 2 wherein the density of agglomerated vacancy defects in the stratum is less than about 10% of the density of agglomerated vacancy defects between the imaginary central plane and the stratum.

5. The single crystal silicon wafer as set forth in claim 2 wherein the density of agglomerated vacancy defects in the stratum is less than about $1 \times 10^3$ defects/cm$^3$.

6. The single crystal silicon wafer as set forth in claim 1 wherein $D_s$ is between about 5 nm and about 500 nm.

7. The single crystal silicon wafer as set forth in claim 1 wherein the concentration of light point defects is less than about 2 LPDs/cm$^2$.

8. The single crystal silicon wafer as set forth in claim 1 wherein the concentration of light point defects is less than about 0.5 LPDs/cm$^2$.

9. The single crystal silicon wafer as set forth in claim 1 wherein the silicon wafer has a non-uniform distribution of crystal lattice vacancies in which the peak density is at or near the imaginary central plane of the silicon wafer with the concentration generally decreasing in the direction of the front surface of the wafer such that an oxygen precipitation heat treatment is capable of forming a denuded zone extending inward from the front surface a distance, $D_{dz}$, and oxygen clusters or precipitates in a bulk layer which comprises the region of the silicon wafer between the imaginary central plane and the denuded zone with the concentration of the oxygen clusters or precipitates in the bulk layer being primarily dependent upon the concentration of vacancies.

10. The single crystal silicon wafer as set forth in claim 9 wherein $D_{dz}$ is about 1 $\mu$m to about 100 $\mu$m.

11. A silicon on insulator structure having two generally parallel surfaces, one of which is the front surface of the structure and the other of which is the back surface of the structure and a circumferential edge joining the front and back surfaces of the structure, the structure comprising:

a. a single crystal silicon base layer having two generally parallel borders, one of which is the top border and the other of which is the bottom border which coincides with the back surface of the silicon on insulator structure, and an imaginary central plane between the borders;

b. a single crystal silicon device layer having two generally parallel boundaries, one of which is the upper boundary which coincides with the front surface of the structure and the other of which is the lower boundary;

c. an insulating layer between the top border of the base layer and the lower boundary of the device layer;

d. a first reduced defect stratum comprising agglomerated vacancy defects ranging in width from about 50 nm to about 300 nm dispersed throughout its volume at a density less than about $1 \times 10^3$ defects/cm$^3$, the first reduced defect stratum being generally parallel to the back surface of the structure, and having a thickness $D_{s1}$ and being located in the device layer or the base layer; and e. a first bulk stratum comprising agglomerated vacancy defects ranging in width from about 50 nm to about 300 nm dispersed throughout is volume at a density greater than about $1 \times 10^3$ defects/cm$^3$, the first bulk stratum being generally parallel to the back surface of the structure and being located in the device layer or the base layer.

12. The silicon on insulator structure as set forth in claim 11 comprising a second reduced defect stratum comprising agglomerated vacancy defects ranging in width from about 50 nm to about 300 nm dispersed throughout its volume at a density less than about $1 \times 10^3$ defects/cm$^3$, the second reduced defect stratum being generally parallel to the back surface of the structure, having a thickness $D_{s2}$, and being located in the device layer if the first reduced defect stratum is located in the base layer or in the base layer if the first reduced defect stratum is located in the device layer.

13. The silicon on insulator structure as set forth in claim 11 wherein $D_{s1}$ is between about 5 nm and about 500 nm.

14. The silicon on insulator structure as set forth in claim 13 wherein the first reduced defect stratum extends inward from the top border of the base layer, and the first bulk stratum is located between the imaginary central plane and the first reduced defect stratum.

15. The silicon on insulator structure as set forth in claim 13 wherein the first stratum extends inward from the upper boundary of the device layer and the first bulk stratum is located in the base layer.

16. The silicon on insulator structure as set forth in claim 15 wherein the front surface of the structure is characterized by having a concentration of light point defects that is less than about 3 LPDs/cm$^2$ and a degree of haze which allows the detection of LPDs less than about 0.2 μm LSE.

17. The silicon on insulator structure as set forth in claim 11 wherein the base layer has a non-uniform distribution of crystal lattice vacancies in which the peak density is at or near the imaginary central plane of the base layer with the concentration generally decreasing in the direction of the top border of the base layer such that an oxygen precipitation heat treatment is capable of forming a denuded zone extending inward from the top border a distance, $D_{dz}$, and oxygen clusters or precipitates in a bulk layer which comprises the region of the base layer wafer between the imaginary central plane and the denuded zone with the concentration of the oxygen clusters or precipitates in the bulk layer being primarily dependent upon the concentration of vacancies.

18. The silicon on insulator structure as set forth in claim 17 wherein $D_{dz}$ is about 1 μm to about 100 μm.

* * * * *